United States Patent [19]

Ha

[11] Patent Number: 5,321,738

[45] Date of Patent: Jun. 14, 1994

[54] SWITCH APPARATUS OF A PORTABLE CORDLESS TELEPHONE USING AN ANTENNA

[75] Inventor: Sang-Wook Ha, Suwon, Rep. of Korea

[73] Assignee: SamSung Electronics Co., Ltd., Suwon, Rep. of Korea

[21] Appl. No.: 804,706

[22] Filed: Dec. 11, 1991

[30] Foreign Application Priority Data

May 23, 1991 [KR] Rep. of Korea ............... 1991-7340

[51] Int. Cl.$^5$ .................................................. H04M 11/00
[52] U.S. Cl. ............................................. 379/61; 379/58; 343/702
[58] Field of Search ............... 379/58, 61, 424, 425, 379/448; 455/82, 97; 343/702

[56] References Cited

U.S. PATENT DOCUMENTS

| | | | |
|---|---|---|---|
| 5,109,539 | 4/1992 | Inubushi et al. | 379/433 |
| 5,138,329 | 8/1992 | Saarnimo et al. | 343/702 |

*Primary Examiner*—Curtis Kuntz
*Assistant Examiner*—G. J. Oehling
*Attorney, Agent, or Firm*—Robert E. Bushnell

[57] ABSTRACT

A switch apparatus of a portable cordless telephone for easily performing call incoming and originating functions by using an antenna. A push bar is formed at an edge of an antenna positioned inside a handset, and a push switch formed in the telephone receiver side of the handset has a contact part and a coupling part. The contact part has one protrusion end and another end coupled to the coupling part installed on a printed circuit board. Thus, when drawing the antenna to the exterior of the handset, the call incoming and the call originating functions are capable of being performed without an additional switch operation.

7 Claims, 4 Drawing Sheets

SWITCH APPARATUS OF A PORTABLE CORDLESS TELEPHONE USING AN ANTENNA

BACKGROUND OF THE INVENTION

The present invention relates to a portable mobile cordless telephone apparatus, and more particularly to an on/off switch apparatus of a cordless telephone which can easily perform call incoming and call originating functions.

Generally, in a portable cordless telephone having a handset containing an antenna and a telephone transmitter and receiver a slide switch slid by an adjustment knob positioned at a sidewall or the front of the handset has chiefly been used to act as the on/off switch.

FIG. 1 shows a schematic diagram of a handset of a general cordless telephone. If it is desired to use the cordless telephone, an antenna 10 should be drawn from a handset 30 and a switch should be operated to a talk state from a stand-by state by using an adjustment knob (not shown). Thus, wanted information can be transmitted to a recipient by selecting a telephone number. When a telephone call is finished, the antenna 10 should be inserted into the interior of the handset 30 and the switch should be operated to the stand-by state from the talk state by using the adjustment knob. However, when using the cordless telephone to transmit and receive a message using above switch, if the transmission and reception of the message is performed without drawing the antenna due habit and/or trouble, the characteristic of the field strength in the transmission and reception of the message deteriorates and the failure of call incoming and call originating frequently occurs. Moreover, there are problems of traffic jams, administration, service and the like caused by a repeated retrial. Further, because the adjustment knob is very small in size, careful operation is required. A telephone call may be impossible due to a malfunction of the adjustment knob and in a dark place, the operation of the adjustment is very difficult.

SUMMARY OF THE INVENTION

It is therefore an object of the present invention to provide an on/off switch apparatus of a cordless telephone which can easily perform call incoming and call originating functions.

It is another object of the present invention to provide an on/off switch apparatus of a cordless telephone that is easily operable, even if a user is in a dark place.

In accordance with an aspect of the present invention, a push bar is formed at an edge of an antenna positioned inside a handset. A push switch having a contact part formed of an elastic body protruding from one side thereof and a coupling part on the other side thereof is installed on the microphone side of the handset and is contacted with the push bar when the antenna is drawn from the interior of the handset.

BRIEF DESCRIPTION OF THE DRAWINGS

The above objects and other advantages of the present invention will be more clearly appreciated from the following description taken in conjunction with the accompanying drawings in which.

DETAILED DESCRIPTION OF THE PREFERRED EMBODIMENT

Figure 1:
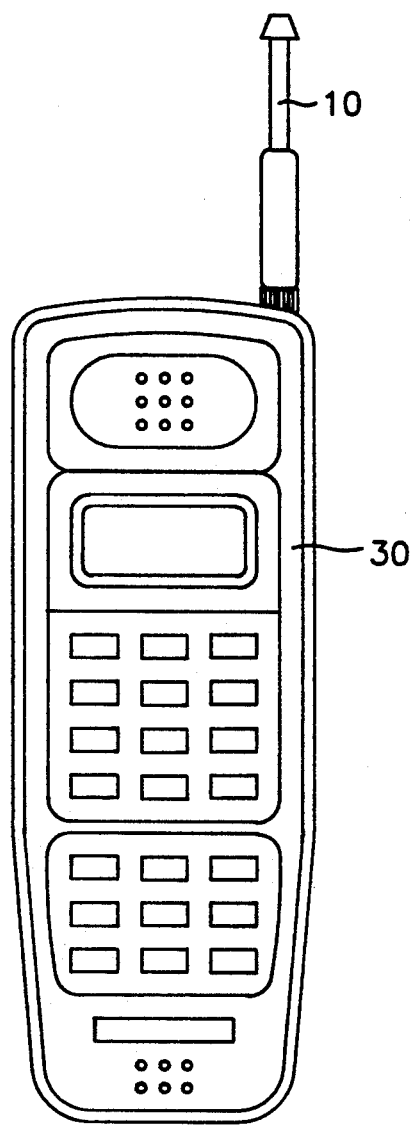
FIG. 1 is a schematic diagram showing a handset of a general cordless telephone.
Figure 2:
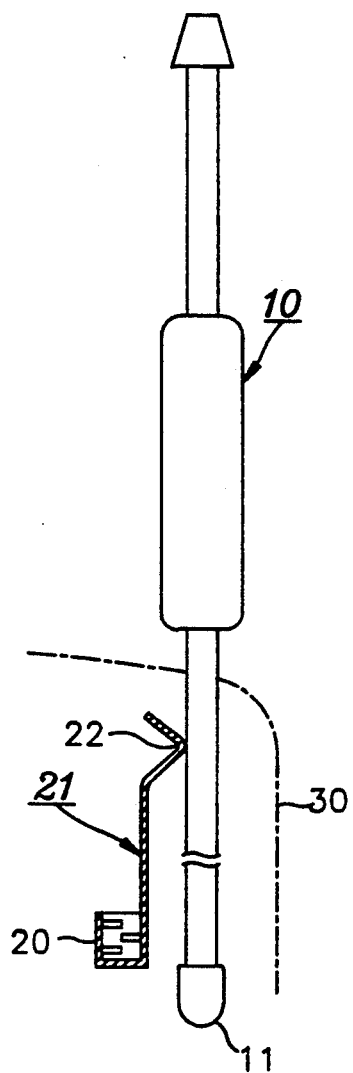
FIG. 2 is a magnified view of the essential section of a switch apparatus according to the present invention.

Referring to FIG. 2, an antenna 10 is installed through the inside and outside of a handset 30 having a telephone transmitter and receiver, so that the antenna 10 is slid from the interior side to the exterior of the handset 30. A push bar 11 is formed at an edge of the antenna 10 positioned inside the handset 30.

Figure 3A:
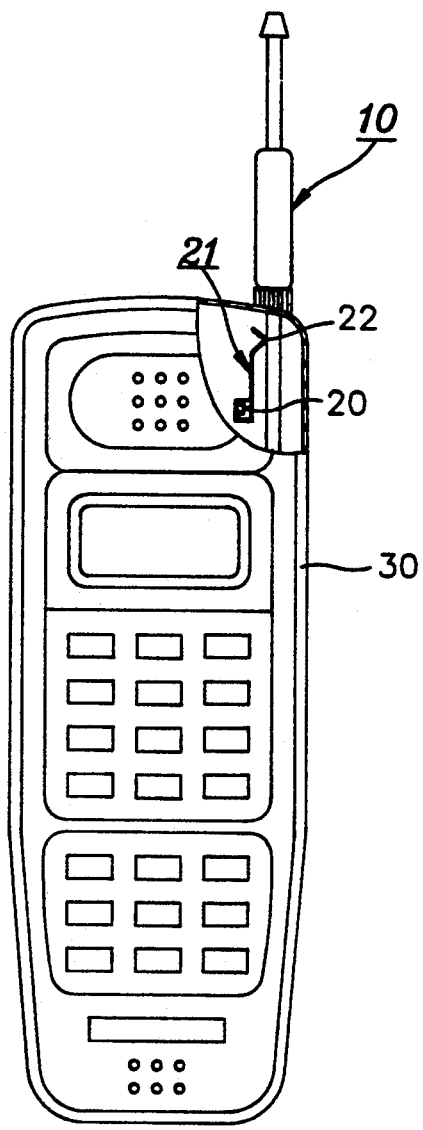
FIG. 3A is a view showing a state in the case that an antenna is inserted into the interior of a handset.
Figure 3B:
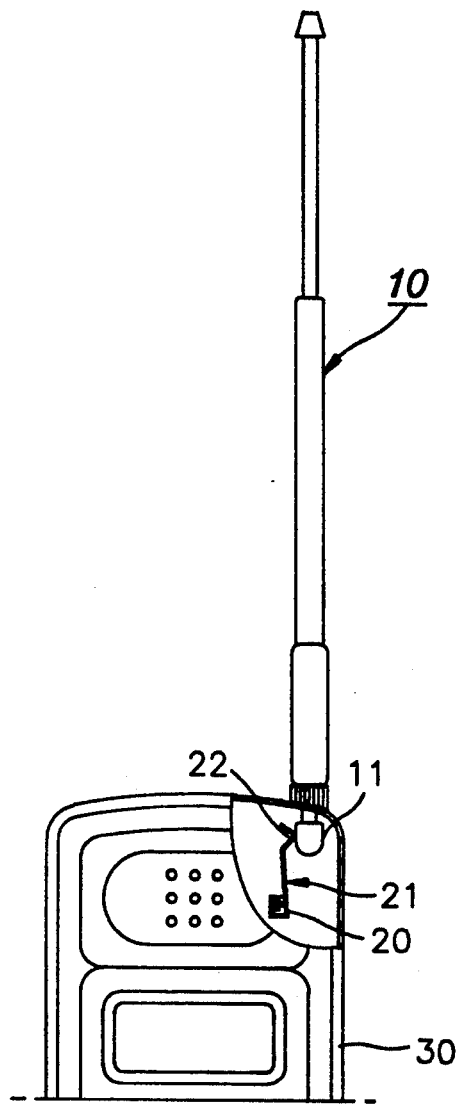
FIG. 3B is a view showing a state in case that an antenna is drawn from the interior of a handset.

A push switch 21 installed on the telephone receiver side of the handset 30 has a contact part 22 and coupling part 20. The contact part 22 of an elastic body has one or more protrusions and one end of the push switch 21 is coupled to the coupling part 20 installed on a PCB (Printed Circuit Board). In order to use the telephone, when drawing the antenna 10 from the interior of the handset 30 as shown in FIG. 3B, the contact part 22 of the push switch 21 is contacted with the push bar 11 and simultaneously the push switch 21 is pushed by the push bar 11. Thus, the push switch 21 is operated to a state capable of calling. Consequently, the push switch 21 accompanying the talk and stand-by states becomes "on" state by the push bar 11 and then a telephone call is performed by selecting a telephone number. If it is desired not to use a telephone for a long time, the antenna 10 should be inserted into the interior of the handset 30 as shown in FIG. 3A. Then, the push bar 11 is released from the contact part 22 of the push switch 21 and the contact part 22 thereof is positioned to an initial state by the elasticity of the push switch 21, with the result that a supply power becomes "off" state.

As described above, since the switch is operated only when the antenna is drawn to the exterior of the handset, even if in a region of a weak signal strength in a transmission and reception propagation, the satisfactory transmission and reception of a message can be performed and even if a user is in a dark place, the switch can be easily operated, thereby improving the reliability of a product.

While the present invention has been particularly shown and described with reference to the preferred embodiment thereof, it will be understood by those skilled in the art that the foregoing and other changes in form and details may be made without departing from the spirit and scope of the present invention.

What is claimed is:

1. A switch apparatus used in a portable cordless telephone with an antenna extending from an interior to an exterior of a handset of said portable cordless telephone, said antenna being slidable between said interior and said exterior of said handset, said switch apparatus comprising:

push bar means formed at an end of said antenna positioned inside said handset; and switch means to operate in association with said push bar means, said switch means having a contact part positioned on a first end and a coupling part positioned on a second end, said contact part having a protrusion extending towards said push bar means;

whereby when said antenna is withdrawn from the one interior side of said handset, said protrusion engages said push bar means to thereby activate said switch means to enable a power-on state of said portable cordless telephone, and when said antenna is retracted into the interior of said handset, said protrusion engages said push bar means to thereby deactivate said switch means to enable a power-off state of said portable cordless telephone.

2. The switch apparatus as claimed in claim 1, wherein said contact part comprises an elastic body.

3. A switch apparatus used in a handset of a portable communication device having an antenna extending from an interior region to an exterior region of the handset and a printed circuit board, said antenna being slidable between an extended position and a retracted position, said switch apparatus comprising:

knob means formed on an interior end of said antenna for moving along a path within said handset in response to said antenna being extended and retracted; and switch means for alternating said handset between a first and second state of performance in response to motion by said knob means;

said first state of performance being a power-on state so that said handset receives and transmits calls and occurs when said antenna is extended to said exterior region of said handset; and said second state of performance being a stand-by state for periods of inactivity of said handset and occurs when said antenna is retracted into said interior region of said handset.

4. The switch apparatus as claimed in claim 3, wherein said switch means comprises:

contact means located at a first end of said switch means and having a protrusion for contacting said knob means when said antenna is extended; and coupling means located at a second end of said switch and installed on said printed circuit board, for alternating said handset between said first and second state of performance in response to motion by said contact means.

5. The switch apparatus as claimed in claim 4, wherein said contact means comprises elastic material.

6. The switch apparatus as claimed in claim 3, wherein said switch means comprises:

contact means for contacting said knob means when said antenna is extended; and coupling means installed on said printed circuit board, for alternating said handset between a first and a second state of performance in response to motion by said contact means.

7. The switch apparatus as claimed in claim 6, wherein said contact means is located at a first end of said switch means and has a protrusion to contact said knob means and said coupling means is located at a second end of said switch means.

* * * * *

UNITED STATES PATENT AND TRADEMARK OFFICE
CERTIFICATE OF CORRECTION

PATENT NO. : 5,321,738
DATED : June 14, 1994
INVENTOR(S) : Sang- Wook Ha

It is certified that error appears in the above-indentified patent and that said Letters Patent is hereby corrected as shown below:

Column 1,

Line 29    After "using" insert ---the---;

Line 40    after "adjustment" insert ---knob---:

Line 56    After "thereof" insert ---,--- :

Signed and Sealed this

First Day of October, 1996

Attest:

BRUCE LEHMAN

Attesting Officer    Commissioner of Patents and Trademarks